(12) United States Patent
Thys et al.

(10) Patent No.: US 10,267,629 B2
(45) Date of Patent: Apr. 23, 2019

(54) MEASUREMENT PROBE UNIT FOR METROLOGY APPLICATIONS

(71) Applicant: NIKON METROLOGY NV, Leuven (BE)

(72) Inventors: Frank Thys, Willebroek (BE); Hans Thielemans, Rotselaar (BE); Raf Nysen, Veltem-Beisem (BE); Laurens Van Horenbeek, Haacht (BE)

(73) Assignee: NIKON METROLOGY NV, Leuven (BE)

( * ) Notice: Subject to any disclaimer, the term of this patent is extended or adjusted under 35 U.S.C. 154(b) by 162 days.

(21) Appl. No.: 15/127,425

(22) PCT Filed: Apr. 8, 2015

(86) PCT No.: PCT/EP2015/057570
§ 371 (c)(1),
(2) Date: Sep. 20, 2016

(87) PCT Pub. No.: WO2015/155209
PCT Pub. Date: Oct. 15, 2015

(65) Prior Publication Data
US 2018/0172442 A1 Jun. 21, 2018

(30) Foreign Application Priority Data

Apr. 8, 2014 (EP) .................... 14163889

(51) Int. Cl.
*G01B 5/012* (2006.01)
*G01B 21/04* (2006.01)
(Continued)

(52) U.S. Cl.
CPC .......... *G01B 21/047* (2013.01); *G01B 5/012* (2013.01); *G01B 7/012* (2013.01); *G01B 11/007* (2013.01); *G01R 1/067* (2013.01)

(58) Field of Classification Search
CPC .... G01B 21/047; G01B 7/012; G01B 11/007; G01R 1/067
(Continued)

(56) References Cited

U.S. PATENT DOCUMENTS 5,778,548 A   7/1998  Cerruti
5,848,477 A  12/1998  Wiedmann et al.
(Continued)

FOREIGN PATENT DOCUMENTS

WO   2009016185 A1   2/2009

OTHER PUBLICATIONS

PCT International Search Report and Written Opinion dated Jun. 26, 2015 for PCT International Patent Application No. PCT/EP2015/057570, 9 pages.

*Primary Examiner* — George B Bennett
(74) *Attorney, Agent, or Firm* — Amster, Rothstein & Ebenstein LLP

(57) ABSTRACT

The present invention provides a dimensional measurement probe unit (100) for attachment to a probe head (200) of a localizer (300), comprising: a measurement probe (150) for dimensional measurement of an object (400); a revolute joint (170) integrated into the measurement probe (150); and a probe unit interface (120) for repeated dismountable connection to a probe head (200) wherein the probe unit interface (120) is revolutely connected to the measurement probe (150) by the revolute joint (170).

23 Claims, 9 Drawing Sheets

(51) Int. Cl.
*G01B 7/012* (2006.01)
*G01B 11/00* (2006.01)
*G01R 1/067* (2006.01)

(58) Field of Classification Search
USPC .......................................................... 33/503
See application file for complete search history.

(56) References Cited

U.S. PATENT DOCUMENTS

| | | | |
|---|---|---|---|
| 9,696,146 B2* | 7/2017 | Blanckaert | G01B 11/2518 |
| 2008/0127501 A1* | 6/2008 | Eaton | G01B 21/047 |
| | | | 33/503 |
| 2015/0153149 A1* | 6/2015 | Pettersson | B25J 18/00 |
| | | | 33/503 |
| 2016/0116276 A1* | 4/2016 | Featherstone | G01B 21/047 |
| | | | 33/503 |
| 2017/0102224 A1* | 4/2017 | Bridges | G01B 11/005 |
| 2017/0248408 A1* | 8/2017 | Ferrari | G01B 11/007 |
| 2018/0058884 A1* | 3/2018 | Rees | G01D 5/24452 |

\* cited by examiner

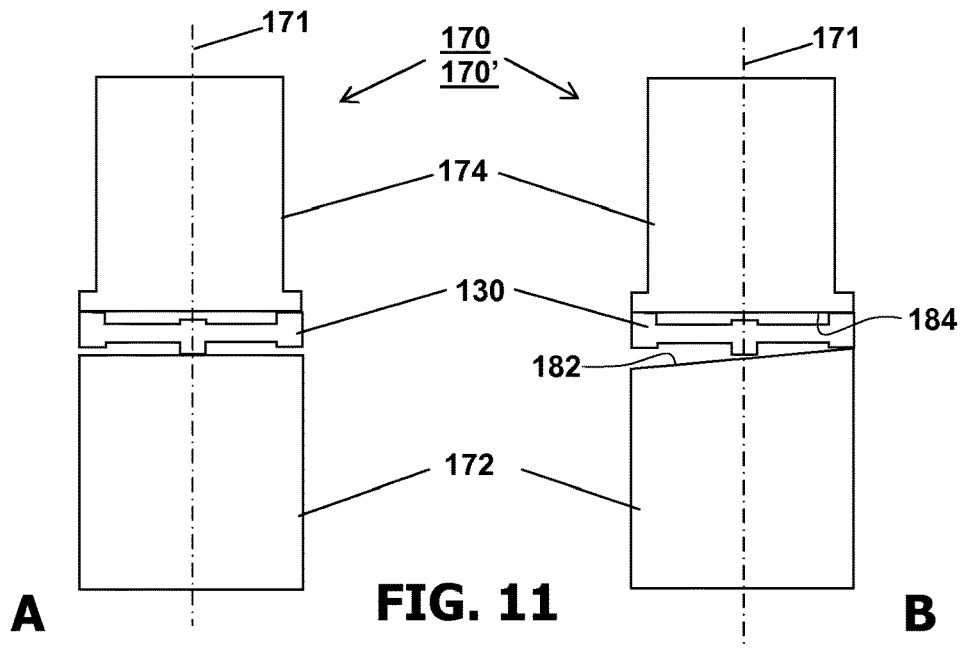
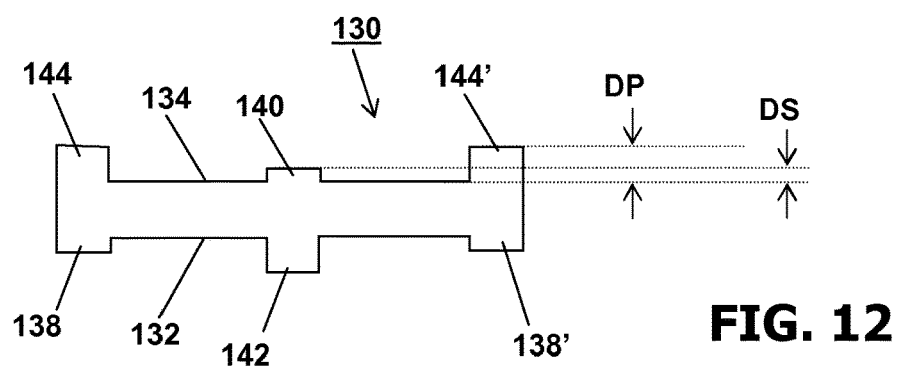
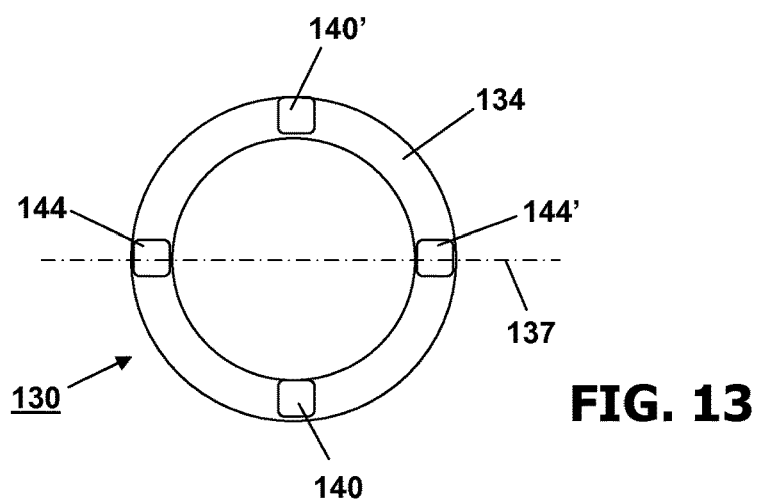

MEASUREMENT PROBE UNIT FOR METROLOGY APPLICATIONS

CROSS-REFERENCE TO RELATED APPLICATIONS

This application is a U.S. national stage entry under 35 U.S.C. § 371 of PCT International Patent Application No. PCT/EP2015/057570, filed Apr. 8, 2015, which claims priority to European Patent Application No. 14163889.0, filed Apr. 8, 2014, the contents of which are incorporated herein by reference in their entirety.

FIELD OF THE INVENTION

The present invention relates to a measurement probe unit for dimensional acquisition of an object.

BACKGROUND OF THE INVENTION

A probe head is used in metrology applications as an adaptor for attachment of a measurement probe to a localiser such as co-ordinate measurement machine. Examples of probe heads include the PH-10 series manufactured by Renishaw. Advantageously, the probe head further serves to angularly orientate the measurement probe relative to the end effector of the co-ordinate measurement machine; typically a probe head has two axes of rotation, optionally be motorised. However, the probe head lacks full flexibility of a third axis of rotation that would allow position of the measurement probe toward the object to be measured. In the art, this is generally solved using a second adaptor connecting the probe head to the measurement probe that provides a further axis of rotation. The prior art describes probe alternative position adjustment mechanisms, for instance, U.S. Pat. No. 5,848,477 discloses a passive contact probe attached to a ball and socket joint having a plurality of discrete selectable angles; the instability of a ball and socket arrangement renders it suitable for the majority of measurement probes. U.S. Pat. No. 5,778,548 discloses a removable measurement probe attached to a probe head, that lacks the flexibility of three rotational axes. WO 2009/016185 discloses a linear scanning laser sensor provided with a fixed connector. The second adaptor is not ideal as it introduces a levering effect, destabilising positions set by the probe head and the localiser, thereby imposing weight restrictions on the measurement probe. In particular, for an optical measurement probe, the restrictions on the lens size and weight lead to a reduction in accuracy. Moreover, the second adaptor introduces additional complexity in subsequent calculations. It can also be a source of signal loss or reduction. Hence, it is an aim of the invention to overcome the problems of the art.

SOME EMBODIMENTS OF THE INVENTION

One embodiment of the invention relates to a dimensional measurement probe unit (100) for attachment to a probe head (200) of a localizer (300), comprising:
- a measurement probe (150) for dimensional measurement of an object (400);
- a revolute joint (170) integrated into the measurement probe (150); and
- a probe unit interface (120) for repeated dismountable connection to a probe head (200) wherein the probe unit interface (120) is revolutely connected to the measurement probe (150) by the revolute joint (170).

The revolute joint (170) is preferably non-dismountably integrated into the measurement probe (150).

The revolute joint (170) may comprise a first body (172) and a second body (174) arranged as to be rotatable relative to the first body (172) around the revolute joint (170) axis of rotation (171),
- the first body (172) may be in fixed relation to the measurement probe (150), and the second body (174) may be in fixed relation to the probe unit interface (120), and
- the first body (172) may be non-dismountably attached to the measurement probe (150).

The revolute joint (170) may be a revolute latching joint (170') configured to latch at a plurality of different discrete revolute angles.

The revolute joint (170) may be a revolute latching joint (170') configured to latch at a plurality of different discrete revolute angles, and
- the first body (172) may be provided with a plurality of discrete first latching elements (176) arranged in a fictive circle, latching element (176) representing a discrete revolute angle, and
- the second body (174) may be provided with at least one second latching element (178) configured to latch with any one of the plurality of discrete first latching elements (176) of the first body (172). It is evident that each first latching elements (176) arranged in the fictive circle, latching element (176) represents a discrete revolute angle.

The number of second latching elements (178) may be three, arranged in a fictive circle. The first latching element (176) and the second latching element (178) may form respective parts of a revolutely dismountable kinematic mount.

The second latching element (178) may comprises one spherical body, for kinematic mounting with two, cylindrical bars comprised in the first latching element (176), or the second latching element (178) may comprise one cylindrical bar, for kinematic mounting with two spherical bodies comprised in the first latching element (176).

The dimensional measurement probe unit (100) may further comprise a spacing ring (130) disposed between the first body (172) and second body (174), comprising an annular ring body provided with at least one pair of diametrically opposed pivoting elements (144, 144') configured to provide pivoting of the first body (172) relative to the second body (174). The dimensional measurement probe unit (100) may further comprise a spacing ring (130) to receive forces between the first body (172) and second body (174), comprising an annular ring body provided with at least one pair of diametrically opposed pivoting elements (144, 144') configured to provide pivoting of the first body (172) relative to the second body (174).

There may be two pairs of pivoting elements, a first pair (142) disposed mutually diametrically opposed on a first side (132) of the spacing ring (130), and a second pair (144, 144') disposed mutually diametrically opposed on a second side (134) of the spacing ring (130), and wherein the first and second pairs of pivoting elements are mutually offset by 90 degrees with respect to the revolute joint (170) axis of rotation (171). The spacing ring (130) may further be provided with two pairs of pivot stop elements (138, 138', 140, 140') complementing the two pairs of pivoting elements, each pivot stop element (138, 138', 140, 140') disposed on the opposite side (132, 134) of the spacing ring (130) to and at the same angular position as a corresponding pivoting element. The spacing ring (130) may be made at least partly from a compliant material, preferably from brass.

The dimensional measurement probe unit (100) may further comprise a threaded rotatable collar (187b) configured to apply a tightening force between the first (172) and second (174) bodies to maintain them in mutual coupling contact, wherein the spacing ring (130) is disposed in coupling contact with the rotatable threaded collar (187b) so as to be reversibly compressed when the rotatable collar (187b) is tightened.

The dimensional measurement probe unit (100) may further comprise an angular measurement member (188) configured to measure an angle adopted by the revolute joint (170) and to provide a signal corresponding to the angular measurement. The dimensional measurement probe unit (100) may further comprise an angular measurement member (188) comprising:

- a shaft (193) oriented along the axis of rotation (171) and in fixed relation to the probe unit interface (120), and
- a geometric structure (190) attached to the shaft (193), configured to occlude light, according to the angular position of the first body (172) relative to second body (174).

The geometric structure (190) may comprise at least one sloped surface. The measurement probe (150) may comprise an external housing (156), and the distance between the probe unit interface (120) and the external housing (156) is minimised to the extent that rotation of the measurement probe (150) around the revolute point (170) avoids collision with probe head (200) or localiser (300). The measurement probe (150) may be an optical probe. The measurement probe (150) may be configured to output signals corresponding to the dimensional measurement. The number of revolute joints integrated into the probe may be only one.

The revolute joint (170) may be provided with a rotation limiter configured to limit the extent of rotation of the revolute joint (170). The rotation limiter may comprise a pair elements, one of the pair being a kidney slot (189a) disposed on the first (172) or second (174) body and the other element of the pair being a pin (189b) disposed on the other body configured to engage with the kidney slot (189a). The kidney slot (189a) may be disposed with a first depth (1800) that engages the pin (189b) to allow mutual rotation of the first (172) and second (174) bodies to the extent of limited rotation of the joint, and may further contain a plurality of discrete notches (1802, 1802') that also engages the pin (189b) to repeatably lock the relative angular positions of the first (172) and second (174) bodies at a plurality of discreet angles which coincide with the discrete revolute angles of the latching joint (170').

Another embodiment of the invention relates to a method for adapting a measurement probe (150) for dimensional measurement of an object (400), to provide an addition degree of freedom of movement, comprising, providing a revolute joint (170) disposed with a probe unit interface (120) for repeated dismountable connection to a probe head (200); and attaching the revolute joint to the measurement probe (150) such that the probe unit interface (120) is revolutely connected to the measurement probe (150) by the revolute joint (170), whereby the attachment is non-dismountable.

BRIEF DESCRIPTION OF THE DRAWINGS

FIGS. 11A and 11B View of first and second bodies of the revolute joint, and a spacing ring there between. In FIG. 11B, the respective coupling surfaces are not parallel.

FIG. 12 depicts a side view of the spacing ring.

FIG. 13 depicts a top view of the spacing ring.

FIG. 15A is an isometric view of an arc shaped slot (kidney slot) disposed on the first body. FIG. 15B is a plan view of the kidney slot, provided with 4 discrete notches. FIG. 15C is a cross section of the kidney slot, detailing the 4 discrete notches are passages or bores.

DETAILED DESCRIPTION OF THE INVENTION

Figure 3:
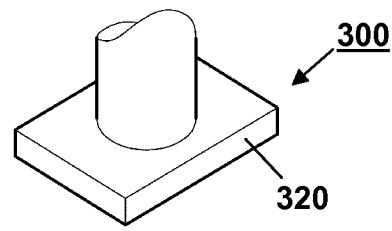
FIG. 3 Schematic representation of part of a localiser, specifically at the effector end.
Figure 2:
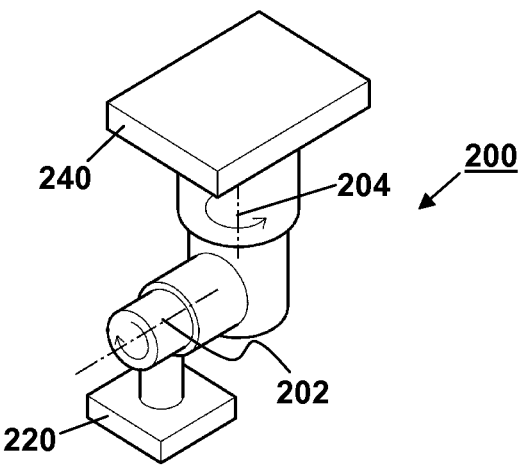
FIG. 2 Schematic representation of a probe head or indexing head according to the invention.

Before the present unit and method of the invention is described, it is to be understood that this invention is not limited to particular units and methods or combinations described, since such units and methods and combinations may, of course, vary. It is also to be understood that the terminology used herein is not intended to be limiting, since the scope of the present invention will be limited only by the appended claims.

As used herein, the singular forms "a", "an", and "the" include both singular and plural referents unless the context clearly dictates otherwise.

The terms "comprising", "comprises" and "comprised of" as used herein are synonymous with "including", "includes" or "containing", "contains", and are inclusive or open-ended and do not exclude additional, non-recited members, elements or method steps. It will be appreciated that the terms "comprising", "comprises" and "comprised of" as used herein comprise the terms "consisting of", "consists" and "consists of".

The recitation of numerical ranges by endpoints includes all numbers and fractions subsumed within the respective ranges, as well as the recited endpoints.

Whereas the terms "one or more" or "at least one", such as one or more or at least one member(s) of a group of members, is clear per se, by means of further exemplification, the term encompasses inter alia a reference to any one of said members, or to any two or more of said members, such as, e.g., any ≥3, ≥4, ≥5, ≥6 or ≥7 etc. of said members, and up to all said members.

All references cited in the present specification are hereby incorporated by reference in their entirety. In particular, the teachings of all references herein specifically referred to are incorporated by reference.

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

In the following passages, different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to a person skilled in the art from this disclosure, in one or more embodiments. Furthermore, while some embodiments described herein include some but not other features included in other embodiments, combinations of features of different embodiments are meant to be within the scope of the invention, and form different embodiments, as would be understood by those in the art. For example, in the appended claims, any of the claimed embodiments can be used in any combination.

In the present description of the invention, reference is made to the accompanying drawings that form a part hereof, and in which are shown by way of illustration only of specific embodiments in which the invention may be practiced. Parenthesized and/or emboldened reference numerals affixed to respective elements merely exemplify the elements by way of example, with which it is not intended to limit the respective elements. It is to be understood that other embodiments may be utilised and structural or logical changes may be made without departing from the scope of the present invention. The following detailed description, therefore, is not to be taken in a limiting sense, and the scope of the present invention is defined by the appended claims.

Figure 1:
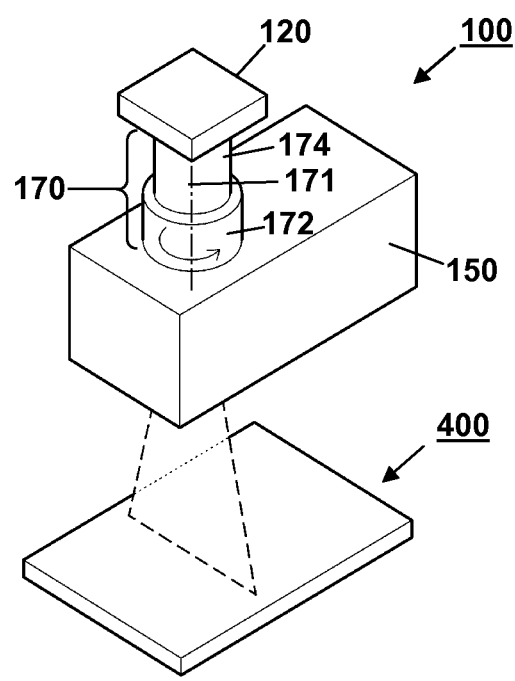
FIG. 1 Schematic representation of a dimensional measurement probe unit according to the invention.

The present invention relates to a dimensional measurement probe unit (100), also known as a "probe unit" herein, for attachment to a probe head (200) for a localizer (300). With reference to FIG. 1, the probe unit (100) comprises a measurement probe (150) for dimensional measurement of an object (400), and a revolute joint (170) integrated into the measurement probe. The probe unit (100) further comprises a probe unit interface (120) for repeatable dismountable connection to the probe head (200) wherein the probe unit interface (120) is revolutely connected to the measurement probe (150) by the revolute joint (170). By having a repeatable dismountable connection, the respective parts are intended for repeatable mutual dismounting and remounting that allows interchangeability; the connection is not intended to be permanent.

Figure 4:
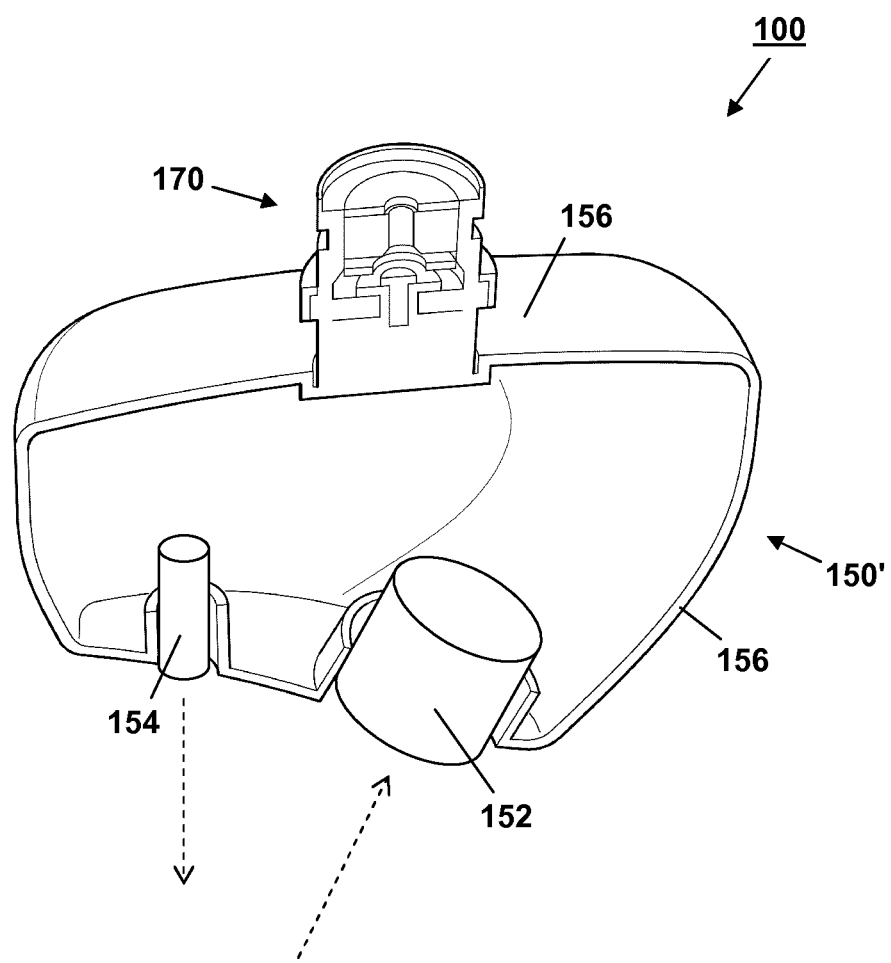
FIG. 4 Schematic representation of an exemplary dimensional measurement probe unit according to the invention, that contains an optical non-contact probe.
Figure 5:
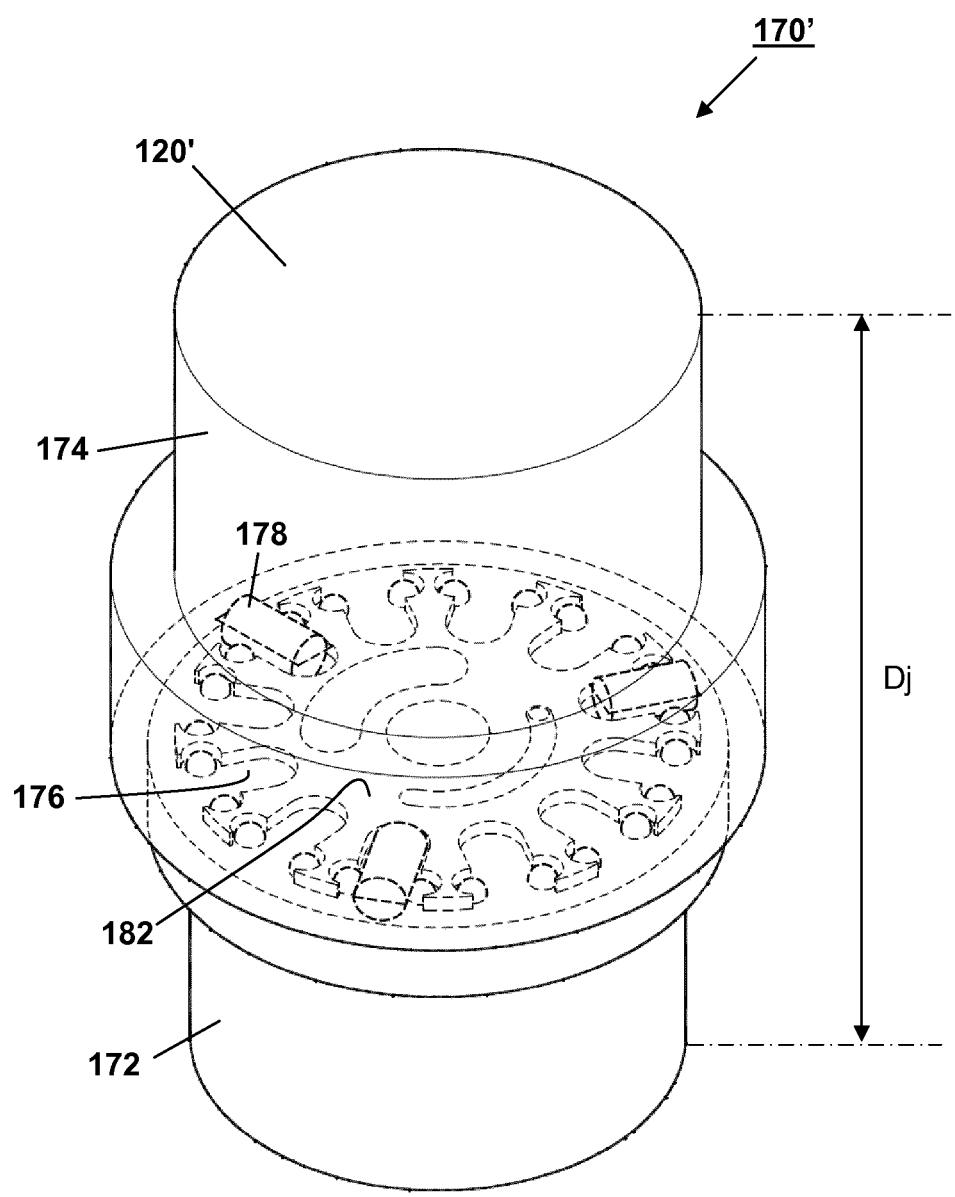
FIG. 5 Schematic interior view of an exemplary revolute joint of a measurement probe unit, that is a latching joint.

The measurement probe (150) may be any type of dimensional measurement probe that outputs signals corresponding to dimensional measurements of the object (400). The signals may be any such as electrical, optical or electromagnetic (e.g. radio signals). Typical measurement probes (150) include an optical probe (e.g. optical scanning probe, laser scanner, profile probe), touch contact probe, or camera. The measurement probe (150) typically comprises a detector (152) for detecting a measurement parameter such as light or force. A touch contact probe typically comprises a touch-trigger assembly in addition to signal-generating components. Preferably the measurement probe is an optical probe (150'). Typically an optical probe (150') such as depicted in part in FIG. 4 is an optical non-contact probe, and comprises an optical detector (152) for detecting light reflected by the object to be measured (400), in addition to the signal-generating components. The optical detector (152) may be one or two dimensional. The optical detector (152) may comprise a CMOS or CCD sensor. The optical detector (152) may comprise a lens system for focusing light from the object. A light source (154) such as a laser may be included in the optical probe (150') or may be separate. The laser may project a single stripe, multiple stripes that may or may nor cross, or a geometric pattern.

The measurement probe (150) typically comprises a rigid chassis on which components are mounted. The measurement probe (150) typically comprises an external housing (156) for protection of the components. According to one aspect, the chassis may be the external housing (156), in which case the components are mounted in relation to the external housing. According to one aspect of the invention, the measurement probe is an optical probe (150'), and the optical detector (152) for detecting light reflected by the object to be measured (400) is in fixed relation to the chassis. The optical detector (152) may be rigidly attached to the chassis. The light source (154) may in fixed relation to the chassis. The light source (154) may be rigidly attached to the chassis.

A measurement probe is known in the art, as described, for instance, in EP 1 391 690, EP 0 840 880 and EP 1 984 695 to name a few. Examples of commercially available measurement probes that may be utilised in the invention include the LC15Dx laser scanner, LC60Dx laser scanner, LC50Cx laser scanner, and XC65Dx(-LS) digital Cross Scanner all manufactured by Nikon Metrology.

The revolute joint (170) typically comprises a first body (172) and a second body (174) arranged as to be rotatable relative to the first body (172) around the revolute joint (170) axis of rotation (171). It may also be known herein as a revolute joint unit. Examples of a revolute joint are depicted in detail in FIGS. 1 and 5 to 7. The first body (172) may be fixed in relation to the optical probe (150), more in particular to the chassis, or to the external housing (156), or to the optical detector (152). The second body (174) may be in fixed relation to the probe unit interface (120).

The first (172) and second body (174) may be non-separably attached. The first (172) and second body (174) may be non-dismountably attached to each other. The first (172) and second body (174) may be non-repeatable-dismountably attached to each other. The first and second body, while being connected by a revolute joint, may be in mutual permanent attachment.

The revolute joint (170) may be a co-axial revolute joint or a non-coaxial revolute joint (i.e. angled revolute joint). A co-axial revolute joint is where the axes of rotation of the first and second bodies are co-axial. A non-co-axial revolute joint is where the axes of rotation of the first and second bodies cross. Where it is a non-coaxial revolute joint, the respective axes may cross at an angle of 50, 60, 70 or 80 deg. There is preferably one revolute joint in the probe unit (100). There is preferably only one revolute joint (170) in the probe unit (100). It provides one degree of freedom of movement.

The first body (172) may have any outer shape, for instance, cylindrical, hexagonal, cuboid. It is preferably essentially cylindrical in shape. It is preferably rigid. It is attached at one end (e.g. probe end) to the measurement probe (150). The attachment is preferably non-repeatably dismountable that is to say, permanent and also rigid. Preferably the attachment is to a chassis of the measurement probe (150) that may be internal or external (e.g. the probe housing (156)). The other end of the first body (172) comprises a first coupling surface (182, FIGS. 5 to 7) that couples with and is disposed adjacent to a corresponding a second coupling surface (184, FIG. 6) of the second body (174). The first coupling surface (182) and the measurement probe (150) are in fixed relation. When the revolute joint (170) is described as integrated into the measurement probe (150), it is meant the attachment is non-dismountable, preferably non-repeatably dismountable, that is to say, permanent and also rigid. In particular, it is meant that the first body (172) is non-dismountably attached, preferably non-repeatably dismountably attached to the measurement probe (150).

The second body (174) is preferably essentially cylindrical in shape and rigid. It has at one end (e.g. joint end) a second coupling surface (184) that couples with and is disposed adjacent to the first coupling surface (182) of the first body (172). The other end of the second body (174) comprises the probe unit interface (120). The second coupling surface (184) is in fixed relation to the probe unit interface (120).

The first and second bodies are maintained in revolute relation and in coupling contact with each other. A force between the first (172) and second (174) bodies may be applied to maintain them in mutual coupling contact. The force may be provided, for example, by an outer clamp or using a central retaining pin or screw.

Figure 6:
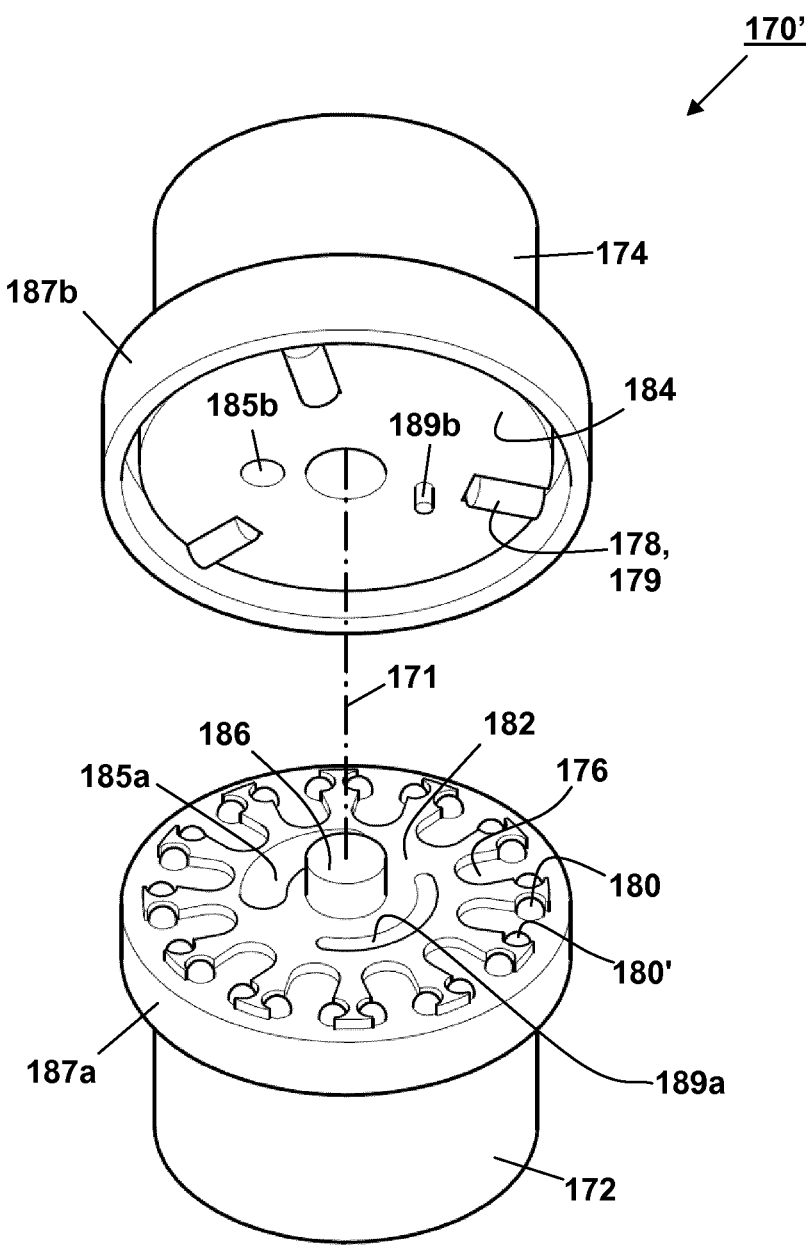
FIG. 6 Schematic opened view of an exemplary revolute joint of a measurement probe unit, that is a latching joint.
Figure 7:
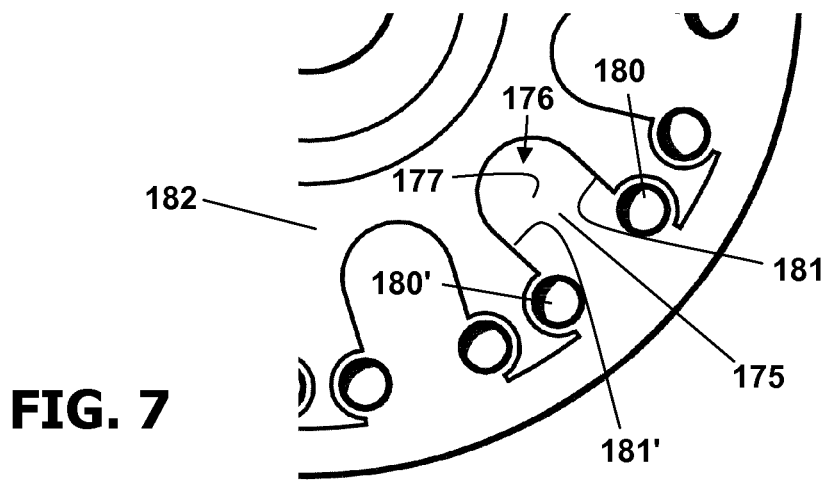
FIG. 7 Detail of a first coupling surface of a revolute joint of a measurement probe unit, that is a latching joint.

The outer clamp may comprise a rotatable collar (187b) that is threaded. The rotatable collar (187b) may be configured to reversibly or repeatably tighten the first (172) body relative to the second (174) body. The rotatable collar (187b) having an inner thread may be provided on one of the first (172) or second (174) bodies, and outer thread (187a) adapted to engage with the thread of the rotatable collar (187b) provided on the other body. The first (172) and second (174) bodies may be relatively rotated when the outer clamp is released by partially unscrewing the rotatable collar (187b), and the set angle fixed by tightening the rotatable collar (187b). It is understood that the rotatable collar (187b) engages with a flange (187c) on the edge of the relevant body that stops the rotatable collar (187b) from advancing past the edge and which transmits the tightening force from the rotatable collar (187b) to other body. In FIG. 6, the rotatable collar (187b) is provided on the second body (174) that is also disposed with the flange (187c); the first (172) body is provided with the outer thread (187a). The rotatable collar (187b) is in rotatable relationship with the associated body (first (172) or second (174) bodies) and is also in slidable relationship therewith.

Figure 14:
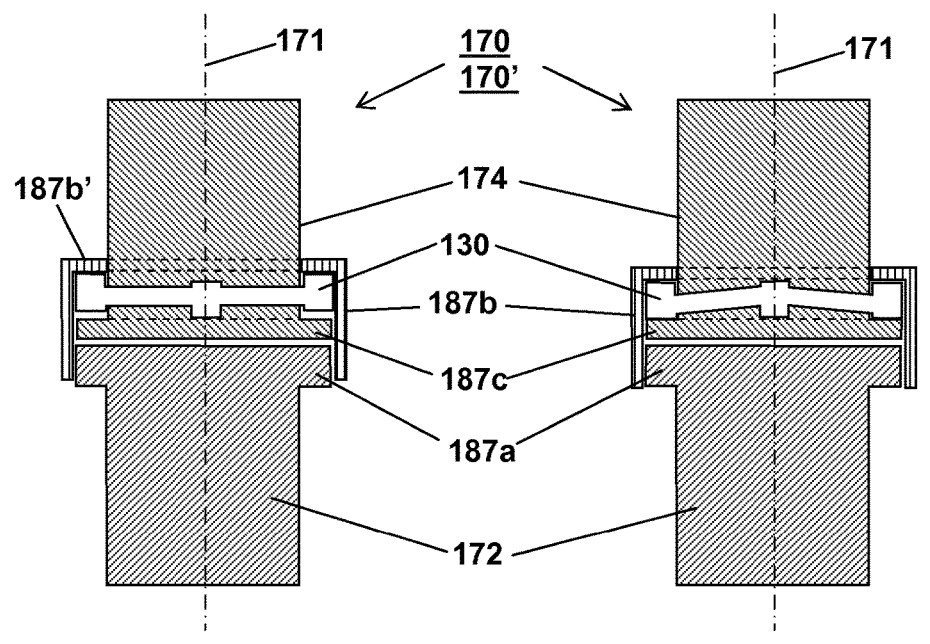
FIG. 14A is a cross-section of first and second bodies of the revolute joint, and a spacing ring disposed between the flange and collar of the second body.
In FIG. 14B, the spacing ring is compressed.

The skilled person would appreciate the construction of the rotatable collar (187b), and, as a general guidance, it has hollow cylindrical form, the inner wall of the cylinder being at least partially threaded, and one end of the hollow cylinder provided with an inward lip that engages with the flange (187c). Where a spacing ring (130) is provided between the rotatable collar (187b) and the flange (187c) (see later below), the inward lip engages with the spacing ring (130). FIGS. 14 A and B depict a rotatable collar (187b) where in the inward lip (187b') contacts the spacing ring (130).

Advantageously, the outer clamp provides a highly stable coupling between the first (172) and second (174) bodies, while allowing reversible release of the first (172) and second (174) bodies to allow angle selection.

A central pin (186) or outer rim may be employed to align the first (172) and second (174) bodies around the axis of rotation (171). Optionally, an annular spacing ring (see below) may be employed to provide alignment and spacing.

The first (172) and second (174) bodies may each be disposed with a central bore extending the length of the body. Where a central pin (186) is employed, it may be hollow or solid. The first and second bodies may be made at least partially from any suitable material, having the requisite strength to support the measurement probe (150), and while also being light weight. A suitable material is aluminium.

Electrical cables may be passed between the first (172) and second (174) bodies through the aforementioned hollow central pin. Alternatively, they may pass via a pair of mutually aligned slots in the coupling surfaces of the respective bodies. One slot may be arc-shaped (cabling kidney slot) to facilitate movement of the cable within the range of angular movement of the revolute joint.

The revolute joint (170) may be provided with a rotation limiter configured to limit the extent of rotation of the joint (170). The rotation limiter may limit the extent of rotation to, for instance, 30 deg, 60 deg, 90 deg, 120 deg, 150 deg, or a value in the range between any two of the aforementioned values, preferably to 90 deg. The rotation limiter may comprise a pair elements, one of the pair being an arc-shaped slot also known as a kidney slot (189a) disposed on the first (172) or second (174) body, and the other element of the pair being a pin (189b) disposed on the other body. In FIG. 6, the kidney slot (189a) is disposed on the first body (172), and the pin (189b) is disposed on the second body (174). Typically the pin (189b) is cylindrical. The pin may be in fixed relation to the body (e.g. first body 172) on which it is disposed. The pin (189a) may be reversibly retractable relative to the coupling surface (e.g. first coupling surface 182) of the body (e.g. first body 172) on which it is disposed. Typically the centre of the arc of the kidney slot (189a) is aligned with axis of rotation (171) of the revolute joint (170). In particular the pair of elements of the rotation limited are disposed respectively on the first (182) and second (184) coupling surfaces.

Figure 15:
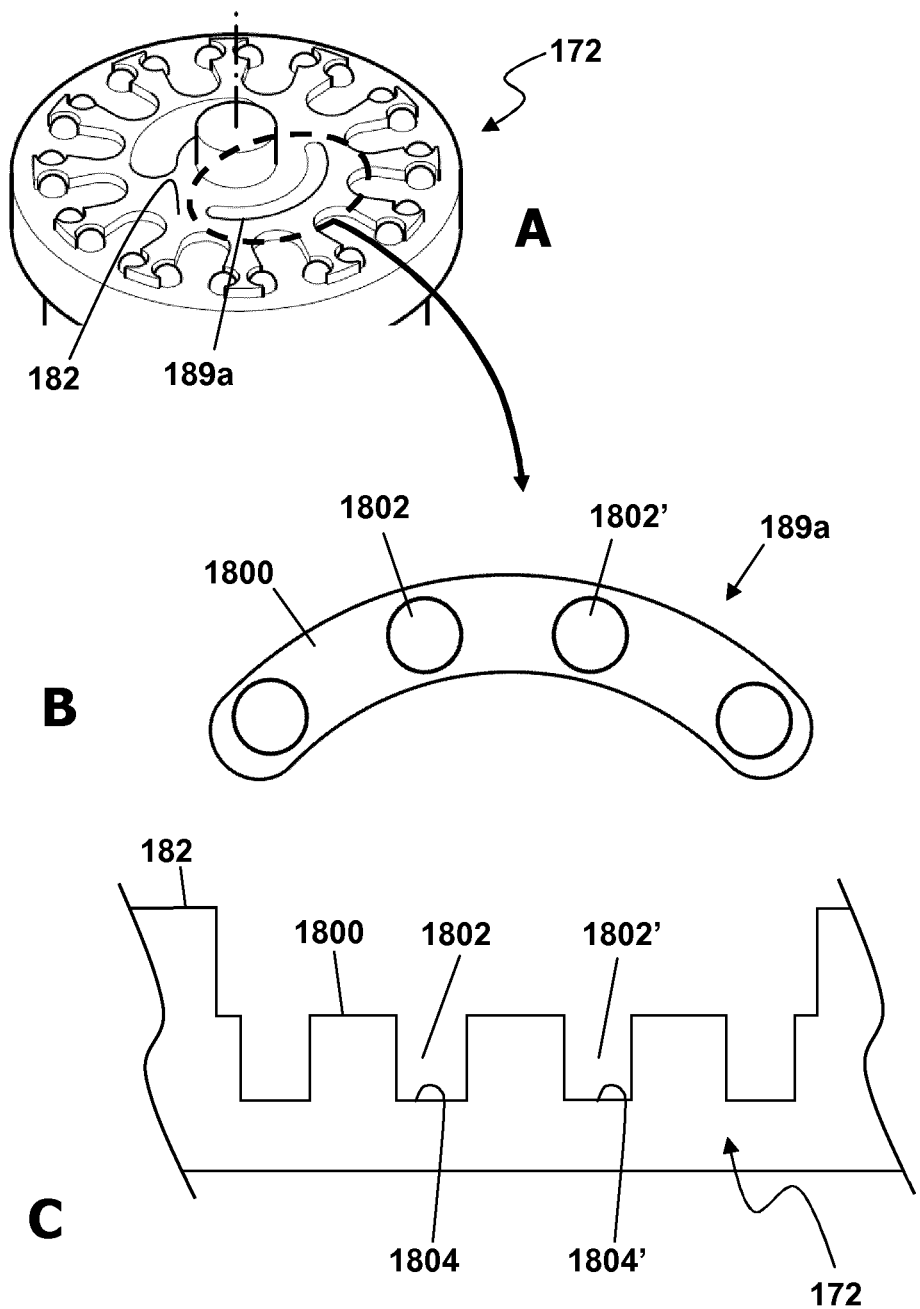
FIG. 15A to C depicts a possible arrangement of a part of a rotation limiter.

According to the further aspect of the invention, as shown, for instance in FIG. 15A to C the kidney slot (189a) is disposed with a first depth (1800) that engages the pin (189b) to allow free mutual rotation of the first (172) and second (174) bodies within the aforementioned angular limits, and further contains a plurality of discrete notches (FIGS. 15 A and B, 1802, 1802') that also engages the pin (189b) to lock the relative angular positions of the first (172) and second (174) bodies at a plurality of discreet angles. The locking is temporary i.e. reversible or repeatable. Each notch (1802, 1802') is preferably a discrete passage or bore hole that fittingly receives the pin (189b); each discrete passage or bore hole is provided to second depth (1804, 1804'). The first depth (1802, 1802') is shallower (closer to the coupling surface (182)) than the second depth (1804, 1804'). It is evident that rotation of the first (172) and second (174)

bodies is accompanied by a withdrawal of the pin (189*b*) to the first depth (1802, 1802') that allows a range of limited rotation, and subsequently by advancement of the pin (189*b*) into one of the discrete notches (1802, 1802') to select the discrete angle. Advancement or withdrawal of the pin (189*b*) may be realised by partial separation of the first (172) and second (174) bodies, for instance, by unscrewing the rotatable collar 187*b*. It is an aspect of the invention that the angles determined by the discrete notches (1802, 1802') coincide with the discrete latching angles described below. The combination of discrete notches (1802, 1802') and co-incident discrete latching angles avoids selection of an "inbetween angle" that could lead to distortion of one of the bodies when tightened in that unallowable position. Further, it leads to high degree of probe stability of the selected angle.

According to one aspect of the invention the revolute joint is a revolute latching joint (170') configured to latch the first body (172) relative to the second body (174) at a plurality of different discrete revolute angles. The discrete revolute angles may be fixed. By latching, it is meant a plurality of angular latching positions between the first body (172) and second body (174) are temporarily stabilised. Angles that are not latching angles may be more readily changed (are less stable positions) by the application of torque compared with those angles that are latching angles. The user may unlatch an angular position of the first body (172) relative to the second body (174) by application of torque. Further application of torque latches the angular position of the first body (172) relative to the second body (174) at the next discrete angle. The torque is preferably applied manually, though motorised angle selection is also foreseen.

The first body (172) may be provided with a plurality of discrete first latching elements (176) arranged around a fictive circle. A first latching element (176) on the first body (172) is configured to allow coupling with a complementary second latching element on the second body (174). Each first latching element (176) represents a discrete revolute angle. The fictive circle is centred around the axis of rotation (171) of the revolute joint (170). The number of first latching elements may be 2, 3, 4, 5, 6, 7, 8, 10, 11, 12, 13, 14, 15 or more. The first latching elements (176) are preferably evenly distributed around the fictive circle. For instance, where there are 10 first latching elements, they may be distributed evenly at intervals of 36 deg around the fictive circle. They are preferably oriented in a radial direction with respect to the axis of rotation (171) of the revolute joint (170). The arrangement of the first latching element (176) and second latching element (178) provides the plurality of angular latching (temporary holding) positions, allowing the selection of discrete and fixed angles that are temporarily stabilised.

A first latching element (176) preferably comprises one of a pair of elements making up a kinematic mount, the other element being the second latching element (178). Hence, a first latching element (176) and corresponding (i.e. when latched together) second latching element (178), may form respective parts of a revolutely dismountable kinematic mount. A kinematic mount is known in the art, and typically comprises a pairing of:
- a spherical body with a spherical groove segment (e.g. a hemisphere),
- one or more (e.g. 1) spherical bodies with one or more (e.g. 3) spherical bodies,
- of one cylindrical bar with two or more (e.g. 2) spherical bodies, or
- of two cylindrical bars with one or more (e.g. 1) spherical bodies, that individually or in combination with other kinematic mounts, restrict movement by 3 degrees of freedom. The spherical bodies and/or bars are made from a hard and rigid material such as stainless steel. A first latching element (176) is held in fixed relation (i.e. no displacement nor rotation) with respect the first coupling surface (182), more in particular with respect to the measurement probe (150).

A first latching element (176) may comprise a spherical groove or spherical groove segment configured to receive a reciprocating second latching element (178) that is a spherical body.

Alternatively, a first latching element (176) may comprise an arrangement of two or more (preferably two) cylindrical bars or of two or more spherical bodies, rigidly and fixedly mounted with respect the first coupling surface (182), more in particular with respect to the measurement probe (150). Two or more cylindrical bars or two or more spherical bodies may be mounted in a groove in first coupling surface (182), and configured to contact and restrict the reciprocating second latching element (178). Where there are two cylindrical bars, they are preferably disposed parallel to each other, and to a line radial with respect to the axis of rotation (171) of the revolute joint (170).

In a preferred embodiment, the first latching element (176) comprises a longitudinal groove (175) in first coupling surface (182). The longitudinal groove (175) is preferably oriented in a radial direction with respect to the axis of rotation (171) of the revolute joint (170). The longitudinal groove may have a groove floor (177) and one or more side edges (181, 181'). The two or more spherical bodies (180), preferably two, are arranged on the opposing sides (181, 181') of the longitudinal groove (175). Preferably, there are two spherical bodies (180) arranged on opposing sides of the side edges (181, 181') of the longitudinal groove (175). Preferably, the first coupling surface (182) is disposed with 12 such first latching elements (176), evenly arranged around the fictive circle. The spherical bodies are set into the longitudinal groove (175), so that a segment of each spherical body protrudes from the first coupling surface (182). The spherical bodies are rigidly and fixedly mounted with respect the first coupling surface (182), more in particular with respect to the measurement probe (150). The spherical body is preferably held in place using an adhesive.

The second body (174) may be provided with at least one, preferably three or more discrete second latching elements (178). A second latching element (178) is configured to latch into any one of the plurality of first latching elements (176) of the first body (172), as shown, for instance, in FIGS. 5 and 6. Where there is a plurality of second latching elements (178), they may be arranged around a fictive circle. The fictive circle is centred around the axis of rotation (171) of the revolute joint (170). The number of second latching elements (178) may be 1, 2, 3, 4, 5, 6, 7, 8, 10, 11, 12, 13, 14, 15 or more. The second latching elements (178) are preferably evenly distributed around the fictive circle. The number of second latching elements (178) may be less than the number of first latching elements (176). The number of second latching elements (176) may be 2, 3, 4, or 5 times the number of first latching elements (178).

As mentioned earlier the second latching element (178) preferably comprises one of a pair elements making up a kinematic mount, the other part of the pair being the first latching element (176). The second latching element (178) may comprise:

one or more (preferably one) spherical bodies, for kinematic mounting with one or more (preferably three, preferably arranged as a triangle) spherical bodies of the first latching element (176), one or more (preferably one) spherical bodies, for kinematic mounting with a spherical groove or spherical groove segment of the first latching element (176)), one or more (preferably one) spherical bodies, for kinematic mounting with two or more (preferably two, preferably arranged parallel) cylindrical bars of the first latching element (176), or one or more (preferably one) cylindrical bar, for kinematic mounting with two or more (preferably two) spherical bodies of the first latching element (176).

In a preferred embodiment, the kinematic mount comprises one cylindrical bar of the second latching element, for kinematic mounting with two spherical bodies of the first latching element (176) or two spherical bodies of the second latching element for kinematic mounting with one cylindrical bar of the first latching element (176). Advantageously, the arrangement allow a larger number of discrete revolute angles; the space occupied by two spherical bodies and by one cylindrical bar is less than that required by employing two cylindrical bar and one spherical body.

The spherical bodies and/or cylindrical bars are made from a hard and rigid material such as stainless steel. A second latching element (178) is held in fixed relation (i.e. no displacement nor rotation) with respect the second coupling surface (184), more in particular with respect to the probe unit interface (120).

In a preferred embodiment, the second latching element (178) comprises a longitudinal bar (179) in second coupling surface (184). A longitudinal bar (179) is preferably a cylinder or a cylindrical segment. The longitudinal bar (179) is preferably oriented in a radial direction with respect to the axis of rotation (171) of the revolute joint (170). Preferably, the second coupling surface (184) is disposed with 3 such second latching elements (178), evenly arranged around the fictive circle. The longitudinal bars (179) are set into the second coupling surface (184), so that a segment of each longitudinal bar (179) protrudes from the second coupling surface (184). The longitudinal bars (179) are rigidly and fixedly mounted with respect the second coupling surface (184), more in particular with respect to the probe unit interface (120). The longitudinal bars (179) are preferably held in place using an adhesive.

The arrangement of first latching element (176) and second latching element (178) provides a plurality of discrete angles that can be selected by rotating the revolute joint (170). The kinematic mounting formed by the first (176) and second (178) latching elements further provides a highly accurate placement of the probe (150) at the plurality of angles that avoids wobble between the first body (172) and second body (174) once the position has been set. The level of precision and accuracy is optimised when three evenly spaced second latching elements (178) are used. The arrangement allows a high level angular repeatability.

As mentioned earlier force between the first (172) and second (174) bodies may be applied to maintain them in mutual coupling contact. According to one aspect of the invention a spacing ring (130) is provided to receive forces between the first (172) and second (174) bodies. The spacing ring assists in receiving and distributing force applied between the first (172) and second (174) bodies, applied for instance by a clamp, to maintain said bodies in mutual contact.

The spacing ring (130) may be disposed between the first (172) and second (174) bodies as shown, for instance, in FIGS. 11A and 11B. The spacing ring (130) may be disposed between the rotatable collar (187*b*) and the flange (187*c*) of the one of the bodies (172, 174); in FIG. 14A it is disposed between the rotatable collar (187*b*) and the flange (187*c*) of the second bodies (174). The spacing ring (130) may be disposed in coupling contact with the rotatable threaded collar (187*b*) so as to be reversibly compressed when the rotatable collar (187*b*) is tightened.

The spacing ring (130) comprises an annular ring body, having a first side (132) and opposite thereto a second side (134). The outer profile of the annular ring is preferably circular, as shown, for instance, in FIG. 13. The inner profile of the annular ring is preferably circular; other profiles are possible. The spacing ring (130) is preferably planar.

According to one aspect, the spacing ring is dimensioned to contact the respective first (182) and second (184) coupling surfaces. It is preferably dimensioned to contact the respective first (182) and second (184) coupling surfaces at the periphery of said surfaces. It is preferably dimensioned to avoid contact or overlap with the first (176) and second (178) latching elements. It is preferably dimensioned to provide a gap between the first (172) and second (174) bodies such that the first (176) and second (178) latching elements can mutually engage. The spacing ring (130) may be disposed in fixed relation to the first (172) or second (174) body, for instance, by means of a fixation element such as a screw. The spacing ring (130) may be disposed in fixed relation to the first (172) body. It is preferred that the spacing ring (130) is not fixed to the first (172), or second (174) body, or both.

According to another aspect, the spacing ring (130) is dimensioned to contact the rotatable collar (187*b*) and flange (187*c*). The spacing ring (130) may be dimension to contact the inward lip (187*b*') of the rotatable collar (187*b*). The spacing ring (130) may be disposed in fixed relation to the rotatable collar (187*b*) or the flange (187*c*), for instance, by means of a fixation element such as a screw. The spacing ring (130) may be disposed in fixed relation to the flange (187*c*). It is preferred that the spacing ring (130) is not fixed to the rotatable collar (187*b*) or the flange (187*c*), or both. The spacing ring (130) may be dimension to be fittingly received by an annular void between the body to which it is associated (e.g. second body (174) in FIG. 14) and the rotatable collar (187*b*).

The spacing ring (130) may be provided with a pair of diametrically opposed pivoting elements (e.g. 144 and 144' in FIG. 12), configured to allow pivoting of spacing ring around a pivoting axis. The pivoting axis (FIG. 13, 137) is formed by an imaginary line connecting the diametrically opposed pivoting elements (144, 144'). The pivoting element (144, 144', 142) is a protrusion disposed on one side (132, 134) of the spacing ring (130). The pivoting element (144, 144', 142) has a base end in connection with the body of the annular ring, and an upper end that extends from the base end. It is preferred that the terminus of the upper end may have a flat or rounded surface on which the respective body (FIG. 11, 172, 174), rotatable collar (FIG. 14, 187*b*) or flange (FIG. 14, 187*c*) contacts.

In a preferred aspect, the spacing ring (130) is provided with two pairs of pivoting elements, a first pair (142) disposed mutually diametrically opposed on the first side (132) of the spacing ring (130), and a second pair (144, 144') disposed mutually diametrically opposed on the second side (134) of the spacing ring (130). The first and second pairs of pivoting elements are preferably mutually offset by 90 degrees with respect to the axis of rotation (171). In other words, a first imaginary line drawn between the first pair of pivoting elements, and a second imaginary line (137) drawn between the second pair (144, 144') of pivoting elements mutually cross at an angle of 90 degrees.

The spacing ring (130) may be configured to allow pivoting of first body (172) relative to the second body (174) as shown, for instance, in FIG. 11B, wherein the first (182) and second (184) coupling surfaces are not parallel.

The spacing ring (130) may be configured to allow pivoting of first body (172) relative to the second body (174) wherein the first (182) and second (184) coupling surfaces are not parallel when the spacing ring (130) is disposed between the rotatable collar (187b) and the flange (187c) of the one of the bodies (172, 174) (not shown).

The spacing ring (130) may further be provided with one or more pivot stop elements (138, 138', 140, 140') as shown, for instance, in FIGS. 12 and 13. A pivot stop element limits the pivoting movement of spacing ring (130) around the pivoting axis (137).

The pivot stop element (138, 138', 140, 140') is a protrusion disposed on one side (132, 134) of the spacing ring (130). The pivot stop element (138, 138', 140, 140') has a base end in connection with the body of the annular ring, and an upper end that extends from the base end. It is preferred that the terminus of the upper end has a flat surface on which the respective body (FIG. 11, 172, 174), rotatable collar (FIG. 14, 187b) or flange (FIG. 14, 187c) contacts to limit its movement. The flat surface may have an essentially rectangular (square or oblong) footprint.

In a preferred aspect, the spacing ring (130) is provided with two pairs of pivot stop elements (138, 138', 140, 140'), a first pair (138, 138') disposed mutually diametrically opposed on the first side (132) of the spacing ring (130), and a second pair (140, 140') disposed mutually diametrically opposed on the second side (134) of the spacing ring (130). The first and second pairs of pivot stop elements are preferably mutually offset by 90 degrees with respect to the axis of rotation (171). In other words, a first imaginary line drawn between the first pair of pivot stop elements (138, 138'), and a second imaginary line drawn between the second pair (140, 140') of pivot stop elements mutually cross at an angle of 90 degrees.

In a preferred aspect, the pivoting element (e.g. 142) present on the first side (132) of the spacing ring (130) is complemented by a pivot stop element (140) disposed on the second side (134) of the spacing ring (130) at the same position, specifically at the same angular position. Preferably, each and every pivoting element (e.g. 142) is so complemented.

The height (DS) of a pivot stop element (138, 138', 140, 140') is less than the height of a height (DP) of a pivoting element (144, 144', 142). As shown in FIG. 12, the height of a pivoting element, DP, is measured from its base to its terminal upper end. Similarly, the height of a pivot stop element, DS, is measured from its base to its terminal upper end Where in the spacing ring (130) is disposed between the first body (172) relative to the second body (174) (e.g. FIG. 11), the pivot stop element limits the pivoting movement of first body (172) relative to the second body (174).

Where in the spacing ring (130) is disposed between the rotatable collar (172) and the flange (187c) (e.g. FIG. 14), the pivot stop also element limits the pivoting movement of first body (172) relative to the second body (174).

The pivoting elements, effectively evenly distributed around the spacing ring (130) receive and distribute force applied between the first (172) and second (174) bodies, applied for instance by a clamp, to maintain said bodies in mutual contact. As such, the pivoting elements transmit forces to the body of the annular ring, which having some compliance, may act as a spring. The compliant property maintains optimal contact between the pair of latching elements (176, 178). Additionally, the compliant property facilitates repeated mounting and dismounting of pairs of latching elements (176, 178) in the kinematic mount when a new angle is selected, so minimising wear.

Furthermore, it is difficult to achieve a perfectly parallel alignment between the first coupling surface (182) and the second coupling surface (184); this is illustrated in FIG. 11B. The pivoting elements (142, 144, 144'), allowing tilting between the first body (172) and the second body (174) about two axes, compensates for any alignment imperfections. The same effect is also apparent when the spacing ring (130) is disposed between the rotatable collar (187b) and the flange (187c) of the one of the bodies (172, 174).

The spacing ring (130) also allows the user to determine an optimum manual tightening of the rotatable collar (187b). In a tightened state (FIG. 14B), the spacing ring (130) is compressed and the respective pivot stop elements (138, 138', 140, 140') contact the rotatable collar (187b) on one side and the flange (187c) on the other side, to stop manual tightening.

Preferably, the spacing ring (130) is made at least partly, preferably entirely from brass. Brass provides an inherent lubricity, reducing friction between the first (172) and second (174) bodies. Moreover, it has a compliant property.

The length of the revolute joint (170) is preferably minimised. The skilled person appreciates that a joint where the first (172) and second (174) bodies have insufficient length will cause the measurement probe (150) to collide with the probe head (200) or localiser (300) when certain angles are adopted by the revolute joint (170). Conversely, where the first (172) and second (174) bodies are too long, the revolute joint (170) acts as a lever, the weight of the measurement probe (150) applying an undesirable force on the probe head (200) and localiser (300). Hence, the length is minimised such that at least partial, preferably full range of rotation is still possible and collision with the probe head or localiser is avoided. In other words, the distance between the probe unit interface (120) and the external housing (156) may be minimised to the extent that rotation of the measurement probe (150) avoids collision with probe head (200) or localiser (300). According to one aspect of the invention, the distance, Dj, measured linearly or along the axes of rotation, between the probe unit interface (120) and the probe housing (156) is between 30 and 40 cm.

It can be appreciated that the first latching element (176) and second latching element (178) may, alternatively, be disposed on the second (174) and first (172) bodies respectively.

The revolute joint (170) may be provided with an angular measurement assembly configured to determine the angle adopted along the axis of rotation (171) between the first (172) and second (174) bodies. The angular measurement assembly preferably is capable of providing a signal, such as an electrical signal, corresponding to the adopted angle. The dimensional measurement probe unit (100) may be configured to automatically detect the angle selected between the first (172) and second (174) bodies. The angular measurement assembly may comprise a rotary encoder (e.g. an optical rotary encoder), or a Hall effect sensor, or similar components capable of providing a signal responsive to the adopted angle. Typically one or more components are provided along (e.g. coaxial with) the axis of rotation (171). The angular measurement assembly typically comprises a pair of complementary components, one attached in fixed relation to the first (172) body, and the second attached in fixed relation to the second body (174). For instance, where the angular measurement assembly comprises a rotary encoder, one of the component pairs may be an etched glass plate, and the other, a light source/detector combination.

Figure 8:
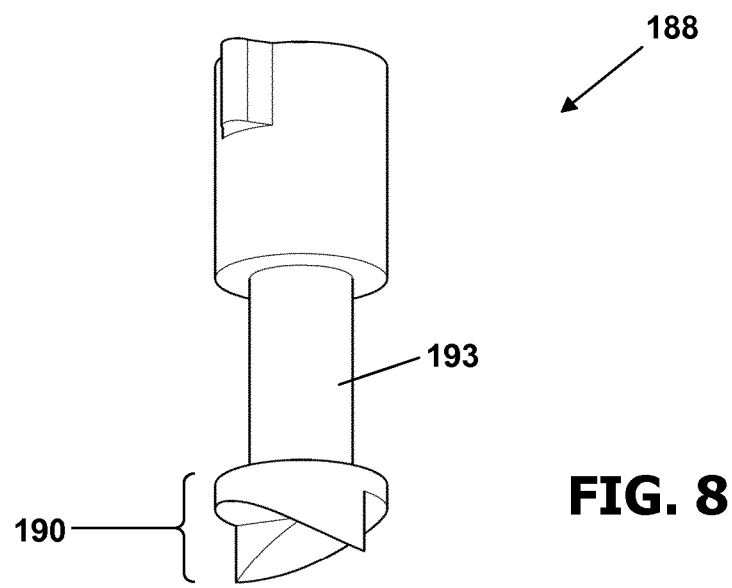
FIG. 8 Schematic illustration of an angle-dependent, light-occluding central pin.
Figure 9:
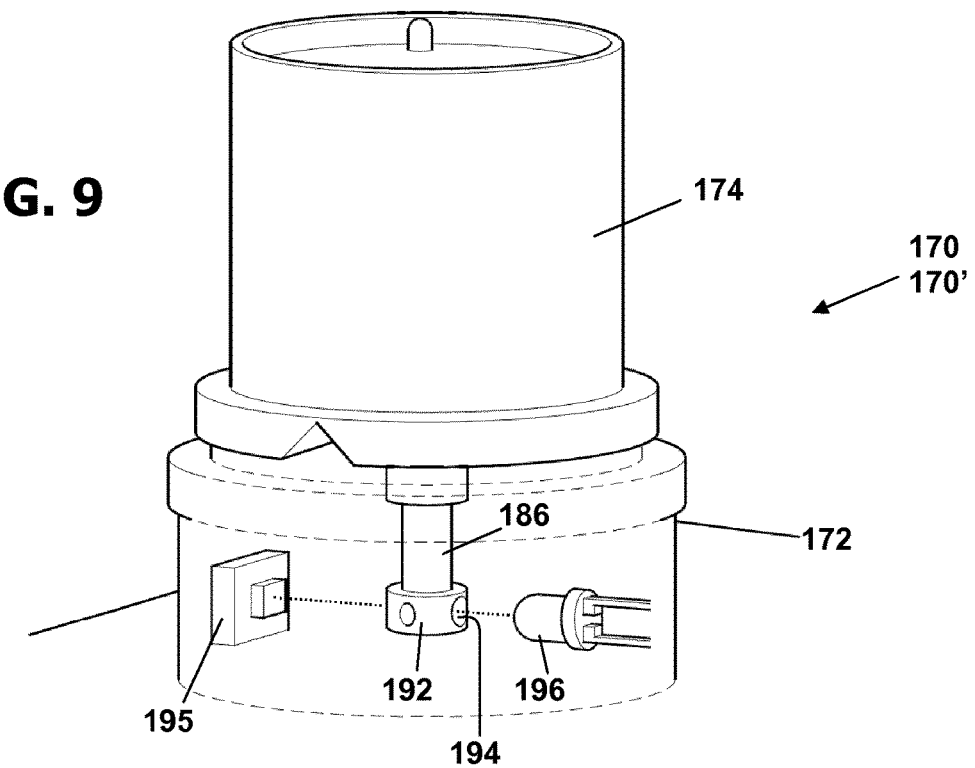
FIG. 9 Schematic illustration of a revolute joint of the invention disposed with the light-occluding central pin.
Figure 10:
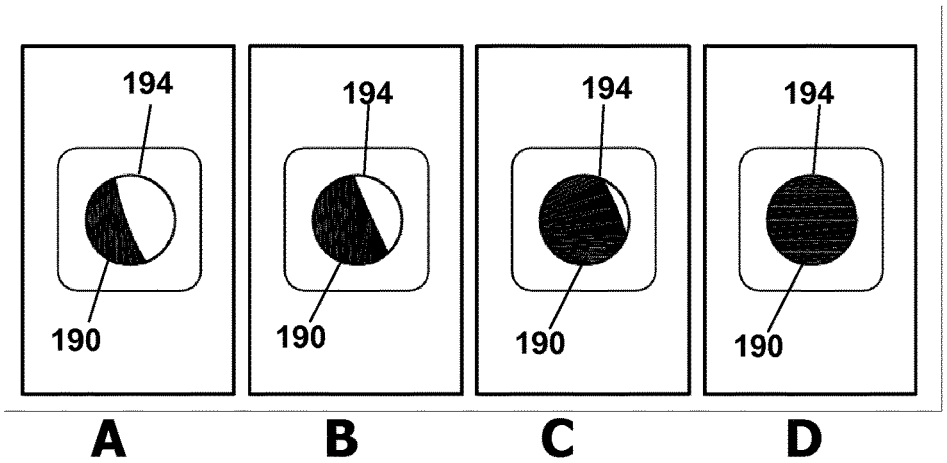
FIG. 10 Schematic illustration of different revolution position of the central pin of FIG. 8 view through an aperture.

According to one aspect of the invention, the angular measurement assembly comprises an angular measurement member (188) disposed in fixed relation to the second body (174) and along (e.g. co-axial with) the axis of rotation (171). The angular measurement member (188) comprises a geometric structure (190) that is an angle-dependent light-occluding structure configured to obstruct the passage of light through a co-operating aperture (192) in accordance with the angle adopted between the first (172) and second (174) bodies as shown, for instance, in FIG. 8. The geometric structure may comprise at least one sloped surface. The sloped surface may be planar or curved. The geometric structure (190) may indicate the angle adopted between the first (172) and second (174) bodies within the limit of a half-turn. In other words, the geometric structure is configured to occlude light, preferably through a co-operating aperture, according to the angular position of the first body (172) relative to second body (174). The measurement member (188) may further comprise a shaft (193) oriented along the axis of rotation and in fixed relation to the second body (174), in particular with the probe unit interface (120). The geometric structure (190) is attached to the shaft (193). In particular, the geometric structure (190) may be attached to one end of the shaft. The geometric structure (190) is preferably provided in fixed relation to the shaft (193). FIG. 9 shows an arrangement whereby a revolute joint is disposed with the shaft (193) and the aforementioned geometric structure covered by a cylindrical housing (192) disposed with diametrically arranged apertures (194). A light emitting diode light source (196) emits a light beams that passes through the pair of apertures and to a light detector (195), occluded to a degree depending on the angle of rotation adopted between the first (172) and second (174) bodies. The amplitude of signal provided by the light detector (195) can be used to determine the angle. FIG. 10 panels A to D schematically depicts the aperture (194) and geometric structure (190) occluding light depending on the angle of rotation, for instance, A indicates an angle of 0 deg, B 30 deg, C 60 deg, and D 90 deg, though it will be appreciated that the geometric structure can be adjusted to accommodate a different range of angles and occlusions.

Advantageously, the present dimensional measurement probe can automatically provide an indication of the angle selected between the first (172) and second (174) body. The information of the angle selected may be combined with the dimensional measurement information from the measurement probe (150). This facilitates rapid dimensional acquisition in cases when the angle between the first (172) and second (174) bodies is changed frequently, for instance, in the case of the measured object having several interior surfaces at otherwise inaccessible angles.

While the foregoing has described one revolute joint (170) connecting the probe unit interface (120) to the measurement probe (150), it is within the scope of the invention that further revolute joints are provided between the probe unit interface (120) and the measurement probe (150). The revolute joints may be tandemly arranged, for instance, to form a kinematic chain. The total number of revolute joints connecting the probe unit interface (120) to the measurement probe (150) may be 1, 2 or 3, or more, preferably 1. The number of revolute joints integrated into the measurement probe (150) is preferably only one.

The probe unit interface (120, 120') is configured for repeatable dismountable attachment to a probe head (200). The precise configuration depends on the probe head (200) employed but generally, the probe unit interface (120, 120') comprises a coupling for repeatable dismountable attachment to the probe head (200), which may comprise a screw, a twist-fit, or snap-fit mechanism. It may further comprise one or more electrical contacts for the passage of signals and/or electrical power. The probe unit interface (120, 120') may further comprise an alignment element, configured to ensure repeatable attachment of the measurement probe unit (100) to the probe head (200) in the same orientation. The probe head may contain a complementary alignment element. In FIG. 1 the probe unit interface (120) is schematically drawn as a cuboid, and in FIG. 5 it is depicted as cylindrical (120'); it will be appreciated that the form of the probe unit interface (120, 120') might depend on the geometry of the measurement probe (150) and probe head interface (220) and would be selected by the person skilled in the art accordingly. Examples of suitable probe heads (200) include the PH10 range manufactured by Renishaw. Advantageously, the measurement probe unit (100) may attach repeatably directly to the probe head (200). The reduction in mechanical joints, compared with, for instance, employing a separate adapter reduces mechanical instability and long term wear, and also reduces the requirement for electrical connectors that increase the complexity and weight of the probe system in additional to increasing the potential for electronic noise and interference.

The probe head (200), also known as an indexing head, is an adapter that attaches at one end to the end effector of a localiser (300) such as a co-ordinate measuring machine (CMM) and at the other end to the measurement probe unit (100). A probe head (200) is typically provided with 1 or 2 axes of rotation (202, 204). The probe head allows the measurement probe unit (100) to adopt different orientations relative to the localiser (300). The angles may be set manually or by motorised control. The angles adopted by the axes may be measured, for instance, using a rotary encoder. Probe heads (200) are well known in the art, for instance the PH10 probe head range manufactured by Renishaw. The probe head (200) comprises at one end a first PH interface (240) for repeatable dismountable attachment to a complementary interface (320) on the localiser (300), and at the other end, end a second PH interface (220) for repeatable dismountable attachment to the complementary probe head interface (120) of the measurement probe unit (100). The respective interfaces may comprise a coupling mechanism, typically one of a pair of reciprocating couplings. Examples of such couplings include a screw-thread, a twist-fit, or snap-fit mechanism. The respective interfaces (220, 240) may further comprise one or more electrical contacts for the through-passage of signals and/or electrical power.

A localiser (300) is well known in the art. Generally speaking, it is a movable support configured to move the measurement probe unit (100) relative to the object (400). The localiser (300) may be a structure, portable or non-portable, on which the measurement probe unit (100) is mounted via the probe head (200), such as for example a tripod. This localiser (300) may be a structure with moving axes, motorised or non-motorised, where the measurement probe unit (100) is mounted on the end of said axes, dependent to all other axes, such as for instance a robot, a milling machine, or coordinate measuring machine (CMM).

These last types of localiser can have the possibility to record the position and/or the rotation of the probe internally, using for instance, encoders (e.g. linear or rotary). The localiser (300) may be any type of CMM, such as a bridge CMM (also known as an X, Y or XYZ CMM), CMM-arm (also known a portable CMM), and a robot CMM arm. The CMM (300) has an end-interface (320) to which the measurement probe unit (100) attaches, via the probe head (200).

For the dimensional calculation of the object, signals received from the probe (150) may be combined with
- angular information concerning the angle adopted between the first (172) and second (174) bodies, optionally provided using signal received from the angular measurement assembly,
- angular information concerning the angles adopted between linkages of the probe head (200), and
- angular information concerning the angles adopted between linkages of the localiser (300).

Using techniques known in the art, the position of the measurement probe (150) relative to a base end of the localiser can be determined, which together with information from the probe enables a calculation of the dimensions of the object (400) as described, for instance, in US 2007/0097381.

The present invention also provides a method for the manufacture of a dimensional measurement probe unit (100) for attachment to a probe head (200) of a localizer (300) as described herein, comprising:
- providing a measurement probe (150) for dimensional measurement of an object (400);
- providing a revolute joint (170) disposed with a probe unit interface (120) for repeated dismountable connection to a probe head (200); and
- attaching the revolute joint to the measurement probe (150) such that the probe unit interface (120) is revolutely connected to the measurement probe (150) by the revolute joint (170).

The present invention also provides a method for adapting a measurement probe (150) for dimensional measurement of an object (400), to provide an additional degree of freedom of movement, comprising,
- providing a revolute joint (170) disposed with a probe unit interface (120) for repeated dismountable connection to a probe head (200); and
- attaching the revolute joint to the measurement probe (150) such that the probe unit interface (120) is revolutely connected to the measurement probe (150) by the revolute joint (170), whereby the attachment is non-dismountable.

The present invention also provides for a use of a dimensional measurement probe unit (100) as described herein for the dimensional measurement of an object.

The invention claimed is:

1. A dimensional measurement probe unit (100) for attachment to a probe head (200) of a localizer (300), comprising:
   - a measurement probe (150) for dimensional measurement of an object (400);
   - a joint having only one degree of freedom of movement that is a revolute joint (170) non-dismountably integrated into the measurement probe (150); and
   - a probe unit interface (120) for repeated dismountable connection to a probe head (200) wherein the probe unit interface (120) is revolutely connected to the measurement probe (150) by the revolute joint (170).

2. Dimensional measurement probe unit (100) according to claim 1, wherein:
   - the revolute joint (170) comprises a first body (172) and a second body (174) arranged as to be rotatable relative to the first body (172) around the revolute joint (170) axis of rotation (171),
   - the first body (172) is in fixed relation to the measurement probe (150), and the second body (174) is in fixed relation to the probe unit interface (120), and
   - the first body (172) is non-dismountably attached to the measurement probe (150), wherein an axis of rotation of the second body (174) has a fixed, non-adjustable direction relative to the first body (172).

3. Dimensional measurement probe unit (100) according to claim 1, wherein the revolute joint (170) is a revolute latching joint (170') configured to latch at a plurality of different discrete revolute angles.

4. Dimensional measurement probe unit (100) according to claim 3, where the revolute joint (170) is a revolute latching joint (170') configured to latch at a plurality of different discrete revolute angles, and
   - the first body (172) is provided with a plurality of discrete first latching elements (176) arranged in a fictive circle, each latching element (176) representing a discrete revolute angle, and
   - the second body (174) is provided with at least one second latching element (178) configured to latch with any one of the plurality of discrete first latching elements (176) of the first body (172).

5. Dimensional measurement probe unit (100) according to claim 4, where the number of second latching elements (178) is three, arranged in a fictive circle.

6. Dimensional measurement probe unit (100) according to claim 4, wherein the first latching element (176) and the second latching element (178) form respective parts of a revolutely dismountable kinematic mount.

7. Dimensional measurement probe unit (100) according to claim 4, wherein
   - the second latching element (178) comprises two spherical bodies for kinematic mounting with one cylindrical bar comprised in the first latching element (176), or
   - the second latching element (178) comprises one cylindrical bar, for kinematic mounting with two spherical bodies comprised in the first latching element (176).

8. Dimensional measurement probe unit (100) according to claim 4, further comprising a spacing ring (130) to receive forces between the first body (172) and second body (174), comprising an annular ring body provided with at least one pair of diametrically opposed pivoting elements (144, 144') configured to provide pivoting of the first body (172) relative to the second body (174).

9. Dimensional measurement probe unit (100) according to claim 8, wherein there are two pairs of pivoting elements, a first pair (142) disposed mutually diametrically opposed on a first side (132) of the spacing ring (130), and a second pair (144, 144') disposed mutually diametrically opposed on a second side (134) of the spacing ring (130), and wherein the first and second pairs of pivoting elements are mutually offset by 90 degrees with respect to the revolute joint (170) axis of rotation (171).

10. Dimensional measurement probe unit (100) according to claim 9, wherein the spacing ring (130) is further provided with two pairs of pivot stop elements (138, 138', 140, 140') complementing the two pairs of pivoting elements, each pivot stop element (138, 138', 140, 140') disposed on the opposite side (132, 134) of the spacing ring (130) to and at the same angular position as a corresponding pivoting element.

11. Dimensional measurement probe unit (100) according to claim 8, wherein the spacing ring (130) is made at least partly from a compliant material, preferably from brass.

12. Dimensional measurement probe unit (100) according to claim 8, further comprising a threaded rotatable collar (187*b*) configured to apply a tightening force between the first (172) and second (174) bodies to maintain them in mutual coupling contact, wherein the spacing ring (130) is disposed in coupling contact with the rotatable threaded collar (187*b*) so as to be reversibly compressed when the rotatable collar (187*b*) is tightened.

13. Dimensional measurement probe unit (100) according to claim 1, further comprising an angular measurement assembly configured to measure an angle adopted by the revolute joint (170) and to provide a signal corresponding to the angular measurement.

14. Dimensional measurement probe unit (100) according to claim 13, wherein the angular measurement assembly comprises an angular measurement member (188) comprising:
  a shaft (193) oriented along the axis of rotation (171) and in fixed relation to the probe unit interface (120), and
  a geometric structure (190) attached to the shaft (193), configured to occlude light, according to the angular position of the first body (172) relative to second body (174).

15. Dimensional measurement probe unit (100) according to a claim 14, wherein the geometric structure (190) comprises at least one sloped surface.

16. Dimensional measurement probe unit (100) according to claim 1, wherein the measurement probe (150) comprises an external housing (156), and the distance between the probe unit interface (120) and the external housing (156) is minimised to the extent that rotation of the measurement probe (150) around the revolute point (170) avoids collision with probe head (200) or localiser (300).

17. Dimensional measurement probe unit (100) according to claim 1, wherein the measurement probe (150) is an optical probe.

18. Dimensional measurement probe unit (100) according to claim 1, wherein the measurement probe (150) is configured to output signals corresponding to the dimensional measurement.

19. Dimensional measurement probe unit (100) according to claim 1, wherein the number of revolute joints integrated into the probe is only one.

20. Dimensional measurement probe unit (100) according to claim 1, wherein the revolute joint (170) is provided with a rotation limiter configured to limit the extent of rotation of the revolute joint (170).

21. Dimensional measurement probe unit (100) according to claim 20, wherein the rotation limiter comprises a pair elements, one of the pair being a kidney slot (189*a*) disposed on the first (172) or second (174) body and the other element of the pair being a pin (189*b*) disposed on the other body configured to engage with the kidney slot (189*a*).

22. Dimensional measurement probe unit (100) according to claim 21, wherein the kidney slot (189*a*) is disposed with a first depth (1800) that engages the pin (189*b*) to allow mutual rotation of the first (172) and second (174) bodies to the extent of limited rotation of the joint, and further contains a plurality of discrete notches (1802, 1802') that also engages the pin (189*b*) to repeatably lock the relative angular positions of the first (172) and second (174) bodies at a plurality of discreet angles which coincide with the discrete revolute angles of the latching joint (170').

23. A method for adapting a measurement probe (150) for dimensional measurement of an object (400), to provide an addition degree of freedom of movement, comprising,
  providing a joint having only one degree of freedom of movement that is a revolute joint (170) disposed with a probe unit interface (120) for repeated dismountable connection to a probe head (200); and
  attaching the revolute joint to the measurement probe (150) such that the probe unit interface (120) is revolutely connected to the measurement probe (150) by the revolute joint (170), whereby the attachment is non-dismountable.

\* \* \* \* \*